United States Patent [19]
Bauer et al.

[11] Patent Number: 5,882,400
[45] Date of Patent: Mar. 16, 1999

[54] METHOD OF PRODUCING A LAYER STRUCTURE AND THE USE OF THE METHOD

[75] Inventors: Stefanie Bauer, Straubing; Martin Fleuster, Aachen; Willi Zander, Aldenhoven-Neu Pattern; Jürgen Schubert, Elsdorf-Berrendorf; Christoph Buchal, Jülich-Barmen, all of Germany

[73] Assignee: Forschungszentrum Julich GmbH, Julich, Germany

[21] Appl. No.: 646,348
[22] PCT Filed: Nov. 12, 1994
[86] PCT No.: PCT/DE94/01361

§ 371 Date: May 10, 1996

§ 102(e) Date: May 10, 1996

[87] PCT Pub. No.: WO95/14250

PCT Pub. Date: May 26, 1995

[30] Foreign Application Priority Data

Nov. 18, 1993 [DE] Germany ............ 43 39 401.9

[51] Int. Cl.⁶ ..................................... C30B 29/30
[52] U.S. Cl. ............... 117/94; 117/96; 117/106; 117/948; 117/7; 117/8; 117/10
[58] Field of Search ............... 117/94, 96, 106, 117/7, 8, 10, 948

[56] References Cited

U.S. PATENT DOCUMENTS

| | | | |
|---|---|---|---|
| 4,904,037 | 2/1990 | Imoto et al. | 350/96.12 |
| 4,938,836 | 7/1990 | Carenco et al. | 117/948 |
| 5,155,793 | 10/1992 | Esselin et al. | 385/131 |

FOREIGN PATENT DOCUMENTS

| | | |
|---|---|---|
| 0 510 883 A3 | 4/1992 | European Pat. Off. . |
| 0 518 059 A1 | 5/1992 | European Pat. Off. . |

OTHER PUBLICATIONS

320 Applied Physics Letters 61(1992) 14 Sep., No. 11, New York, US.

931 Journal of Applied Physics, 62(1987) 1 Oct., No. 7, New York, USA.

320 Applied Physics Letters, 60(1992) 2 Mar., No. 9, New York, US.

320 Applied Physics Letters, 62(1993) 1 Mar., No. 9, New York US.

*Primary Examiner*—Robert Kunemund
*Attorney, Agent, or Firm*—Herbert Dubno; Jonathan Myers

[57] ABSTRACT

The invention concerns a method of producing a surface layer structure by doping a matrix with metal ions. The aim of the invention is to provide a method of this kind in which the depth distribution of the metal ions in the substrate can be regulated, thus optimumizing the doping without incurring any of the disadvantages inherent in the prior art methods. This is achieved by first depositing matrix material on a suitable substrate by laser ablation in an atmosphere of oxygen, thus forming a on surface of the substrate a first layer a matrix material. Dopant is then deposited on the surface of the first layer, followed by more matrix material. The result is a uniform doping of the deposited matrix at a defined depth in the surface layer structure.

13 Claims, 2 Drawing Sheets

METHOD OF PRODUCING A LAYER STRUCTURE AND THE USE OF THE METHOD

FIELD OF THE INVENTION

The invention relates to a method of producing a layered structure, especially suitable for integrated optical components, in which a matrix especially comprised of $LiNbO_3$ is doped with metal ions.

BACKGROUND OF THE INVENTION

Oxidic crystals produced for integrated optics are of increasing significance. Because of its excellent optical characteristics, $LiNbO_3$ constitutes a significant representative of this material class. By doping this substrate material with metal ions (e.g. Ti, Er) a light waveguide can be produced in this substrate material and an optical activation of the $LiNbO_3$ can be effected.

In the case of optical waveguides, the doping, e.g. with titanium ions, effects an increase in the refractive index. The magnitude of the index change is proportional to the titanium concentration and also establishes the index profile and therewith the mode profile of the light in the waveguide. To that extent the quality of the waveguide is determined by the shape of the metal ion depth profile. The production of high quality optical waveguides is known from U.S. Pat. No. 4,480,816.

By doping $LiNbO_3$, with erbium ions (or other rare earth ions), one can obtain optical amplifiers with technologically interesting wavelengths, e.g. at 1.5 $\mu m$.

German Open Application 40 22 090 describes an erbium-doped glass fiber amplifier. It is important for the optimization of such a waveguide amplifier or waveguide laser to have the most exact matching that is possible of the erbium depth profile to the mode profile of the light guided in the waveguide.

In the state of the art there are several processes known in which a matrix can be doped with suitable ions.

Great Britain Open Application 2 250 751 describes as state of the art the production of ferroelectric layers of, for example, $LiNbO_3$ or $LiTaO_3$ on substrates like MgO by laser ablation of corresponding oxidic targets with ArF excimer lasers at $O_2$ partial pressures of $\geq 80$ $\mu bar$ with 0.5 to 3 $J/cm^2$. These layers are used for pyroelectric sensors.

It is known to draw an $LiNbO_3$ monocrystal from a melt doped with metal ions. One thus obtains a homogenous distribution of metal ions. A drawback of this method is that the depth profile is distributed over the entire crystal and is given by the entire composition of the melt without the possibility of individually affecting the depth profile.

It is known to introduce metal ions into a crystal by vapor depositing a metal layer on the crystal and effecting diffusion of the metal ions by heating. In that case the shape of the depth profile follows known diffusion laws and is thus largely fixed. It is a disadvantage in this system that the concentration maximum is always at the crystal surface which for most applications is unsatisfactory. In addition it is a drawback that buried waveguide structures are completely impossible.

From German Open Application 40 22 090 it is known to achieve doping with metal ions in a $LiNbO_3$ monocrystal by ion implantation. The high energy implantation allows the generation of a Gaussian depth profile at optional depths up to several $\mu m$. It is disadvantageous, however, that the crystal is strongly damaged by the implantation process so that a subsequent annealing is required. This results in a diffusion of the metal ions during the annealing so that the advantages of the Gaussian profile is decidedly reduced. Not the least, it is a disadvantage in this process that a costly ion accelerator must be used.

OBJECT OF THE INVENTION

It is the objective of the invention to provide a process of the previously mentioned type in which the depth profile of the metal ions in the substrate is adjustable so that an optimization of the doping in agreement with the desired boundary conditions, is achieved without, however, the drawbacks of the state of the art.

SUMMARY OF THE INVENTION

This objective is achieved by a method with the features according to the present invention.

In processes of the type described earlier, in an oxygen atmosphere with the aid of the laser ablation technique, matrix material, doping material and matrix material anew are deposited in succession. With suitable substrates, the first deposition of matrix material can be omitted.

It has been found that with this procedure after application of the doping material, the doping ions diffuse during the subsequent new application of the matrix material, into the latter. By a suitable choice of the amount of the deposited doping ions in combination with the later deposition of matrix material in a suitable amount, the matrix material can be doped over a given depth profile. Because of the additional deposition by laser ablation of new matrix material, a doping of the latter results from the deeper-lying doping ions. It has been found that the diffusion of the doping material into the overlying matrix region gives rise to a uniform distribution of the doping ions within this matrix. As a consequence, one obtains a uniform doping of the deposited matrix within a defined depth region of the so-produced layer structure.

With the aid of the process according to the invention one can adjust the doped region as a buried doping layer within the structure at a desired depth from the surface by a sufficient new deposition of matrix material depending upon the boundary conditions. The process of the invention thus permits a layer structure to be fabricated, within which a doped region of defined thickness can lie at the desired depth. The doping concentration within the doped layer can be set by appropriate changes of the layer structure temperature or the substrate temperature during the deposition of the matrix material or the doping material. In the simplest case this process allows a layer structure to be obtained with a doping region of a defined width at a defined depth. By variation of the parameters like substrate temperature, amount of deposited doped material or matrix material, a defined layer structure can be selected with defined doping regions and desired concentration profiles within the doping region. The manifold applications of the process enables layer structures to be obtained which are suitable for three dimensional integrated optics.

To accelerate the production of the layer structure, as a preferred variant of the process, at least during the deposition of the matrix material, a substrate temperature of at least 250° C. is selected. Depending upon the choice of the matrix material or the doping material, it is advantageous to operate with elevated temperatures and thus with increased diffusion speeds so that advantageously the production of the layer structure can be achieved in a shorter time.

It is advantageous to heat the so-produced layer structure after the deposition phases for the respective materials, in an oxygen atmosphere. The crystal quality of the layer structure can thereby be improved. Under certain circumstances, the surface of the layer structure can achieve such a condition that further layers can be applied thereto. With respect to the use of oxidic monocrystalline materials like $LiNbO_3$ it is advantageous to deposit matrix material and doping material at an oxygen pressure of up to $10^{-2}$ bar, especially an oxygen pressure of $5 \times 10^{-6}$ bar so that an oxygen charging of the matrix material is achieved. The quality of the doped matrix is thereby improved.

An advantageous variant of the process of the invention resides in that the layer formed by deposition is annealed at a temperature of at least 800° C., especially of 1060° C. to improve the crystal quality.

It is advantageous to carry out this annealing in an oxygen atmosphere of at least 0.1 bar. Thereby an optimization of the crystal quality is obtained.

An especially advantageous variant of the process of the invention is achieved in that with the aid of ion beam etching (IBE) the layer structure after one of the deposition steps is laterally structured. Alternatively thereto, the lateral structuring of the layer structure can be effected with the aid of the so-called lift-off technique in a manner known per se with suitable lift-off materials. As lift-off material especially MgO is suitable if $LiNbO_3$ is used as the matrix material. However, the lateral structuring, as will be self-understood, is not limited to these two techniques to the layer fabricated by deposition. Rather it is also possible to achieve a lateral structure after deposition of the doping material. Apart from the possibility provided by the process of the invention to adjust the depth of the doped layer structure with desired concentration profiles, the present technique additionally enables a lateral structuring of the layer.

It is, finally, highly advantageous to utilize the process of the invention several times and with different parameters of temperature, pressure and amount of the deposited matrix material and/or doping material to obtain individually tailored layered structures.

SPECIFIC EXAMPLE

In a vacuum chamber with the aid of the process of the invention a layered structure on the basis of $LiNbO_3$ and an erbium-ion doped region is fabricated as follows:

On an $LiNbO_3$ substrate with the aid of a laser initially with an $LiNbO_3$ target, matrix material is deposited upon the substrate over an ablation time of 300 s with 3000 laser pulses (150 nm layer thickness). Thereafter, the ablation of the matrix material is interrupted and the deposition of doped material is performed from an erbium target during an ablation time of 30 s and with 300 laser pulses (1 nm layer thickness) upon the substrate coated with the deposited $LiNbO_3$. After that, the erbium deposition is stopped and the matrix material is deposited again for a period of 300 s at 3000 laser pulses (150 nm layer thickness) upon the substrate, coated by matrix material and doping material During the entire deposition process, the substrate is held at a temperature of 900° C. by an electrical heater (heating current 8.5 A). In addition, the deposition process in the vacuum chamber was carried out at an oxygen pressure of $3.8 \times 10^{-6}$ bar at an oxygen flux of 30.20 ml/min. The targets were positioned 5 cm from the substrate during the deposition process. The thus produced layered structure was annealed at a temperature of 1060° C. (heating current 9.25 A) for a duration of 180 s for the purpose of oxygen charging and crystallization.

Figure 1:
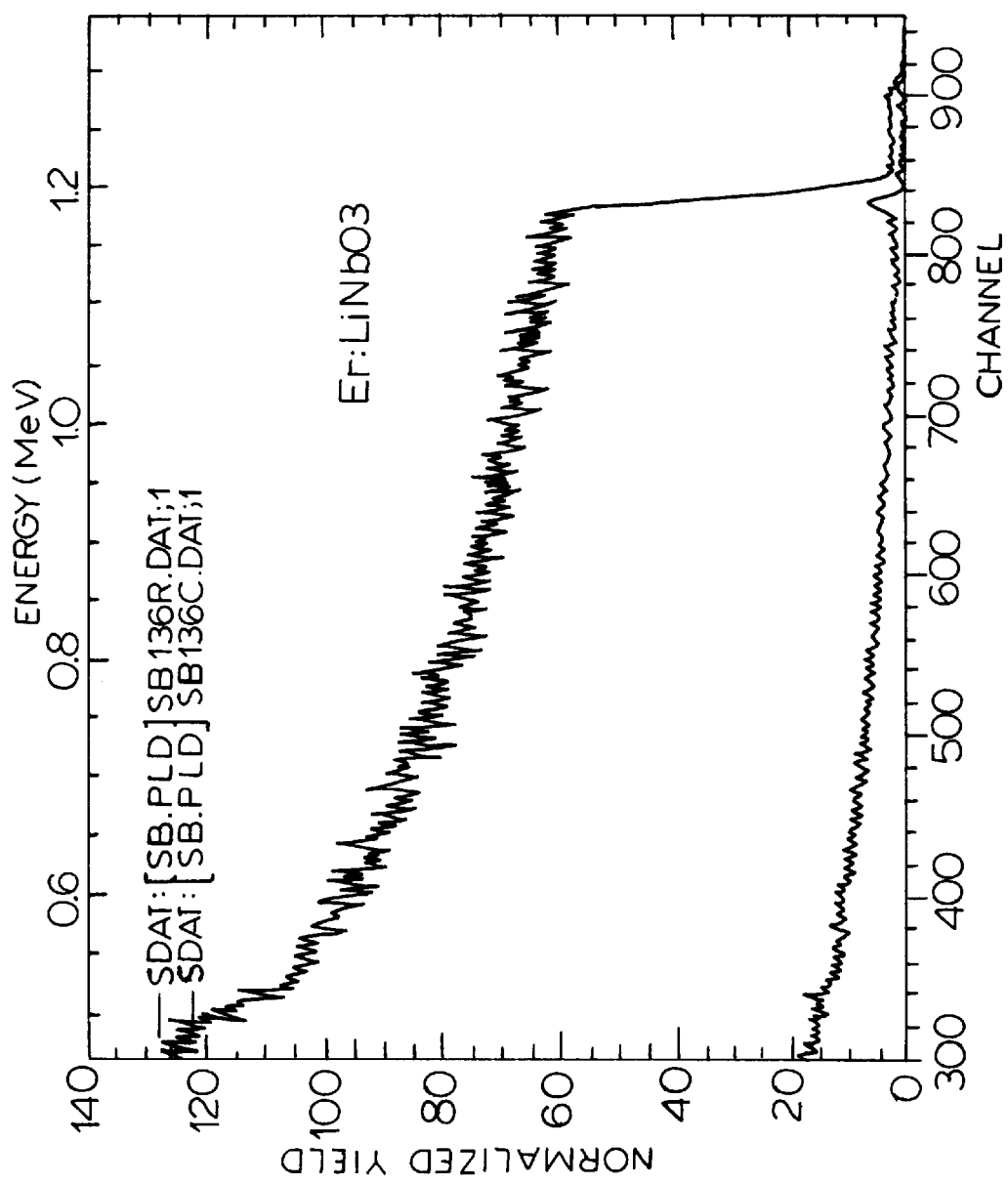
FIGS. 1 and 2 are Rutherford Backstattering (RBS) spectrograms of an erbium doped lithium niobate layered structure.
Figure 2:
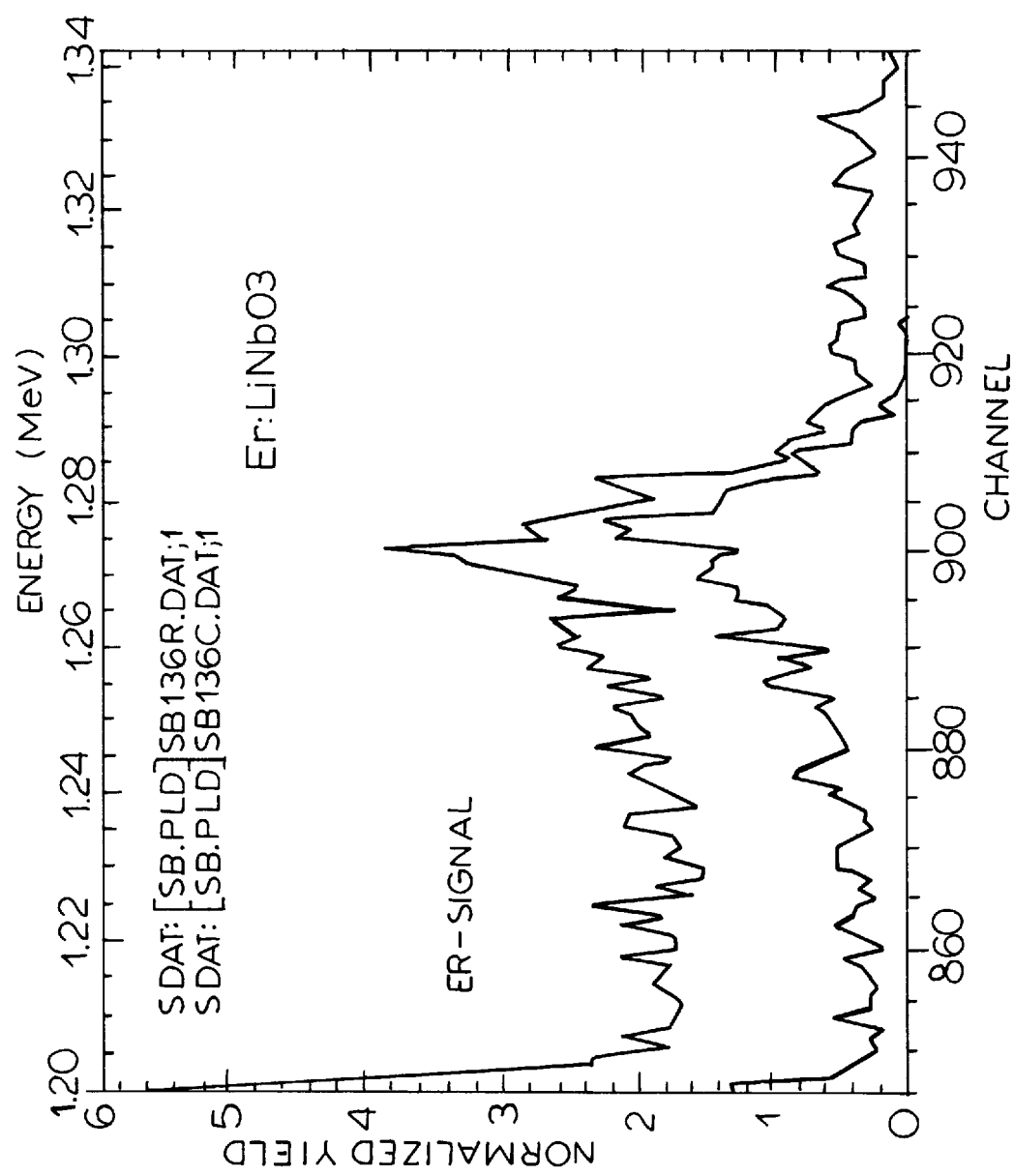

Channeling/RBS-spectra of the erbium doped lithium niobate layer structure are shown in FIGS. 1 and 2, showing a so-called $X_{min}$ value of about 2% which corresponds to the value for a virgin lithium niobate substrate. This confirms the excellent crystal quality of the applied layer obtained by the process of this invention. As can be deduced from FIG. 2 illustrating an enlarged section of the measurement result of FIG. 1) erbium signal channeling is also seen, indicating that the erbium ions are incorporated into the crystal lattice.

We claim:

1. A method for producing a layered structure for integrated optical elements which comprises the steps of:

(a) laser ablating a target material comprising an oxidic monocrystalline material in an oxygen atmosphere to initially deposit on an upper surface of a substrate, a layer of a matrix material comprising said oxidic monocrystalline material, wherein said substrate was not already such a matrix material suitable for doping;

(b) following step (a), depositing metal ions as a doping material on said upper surface of said substrate on which said layer of matrix material has already been deposited; and (c) thereafter depositing additional matrix material on said upper surface of said substrate.

2. A method according to claim 1 wherein according to step (a), a substrate temperature of at least 250° C. is selected during the deposition of the matrix material on the substrate.

3. A method according to claim 1 wherein following step (c) the so produced layer structure is annealed in an oxygen atmosphere.

4. A method according to claim 1 wherein according to step (a) the layered structure is produced by laser ablation at a substrate temperature of at least 500° C.

5. The method according to claim 1 wherein according to step (a) the layer deposition is carried out at an oxygen pressure of up to 10 mbar.

6. The method according to claim 5 wherein the layer deposition is carried out at 5 μbar.

7. The method according to claim 3 wherein the layered structure is annealed at a temperature of at least 800° C.

8. The method according to claim 7 wherein the layered structure is annealed at 1060° C.

9. The method according to claim 3 wherein the layered structure is annealed in an oxygen atmosphere of at least 0.1 bar.

10. The method according to claim 9 wherein the layered structure is annealed at 1.0 bar.

11. The method according to claim 1 wherein the finished or partially finished layered structure formed by means of laser ablation deposition of matrix material and doping material is laterally structured by means of a lift-off technique through the use of MgO as lift-off material or by means of ion beam etching.

12. The method according to claim 1 wherein a multi three-dimensional layered structure for integrated optical components is formed.

13. The method according to claim 1 wherein the metal ions in the doping material are erbium or titanium ions.

* * * * *